(12) United States Patent
Tischler et al.

(10) Patent No.: US 8,653,539 B2
(45) Date of Patent: Feb. 18, 2014

(54) FAILURE MITIGATION IN ARRAYS OF LIGHT-EMITTING DEVICES

(75) Inventors: Michael Tischler, Scottsdale, AZ (US); Philippe Schick, Vancouver (CA); Calvin Wade Sheen, Derry, NH (US); Paul Jungwirth, Burnaby (CA)

(73) Assignee: Cooledge Lighting, Inc., Burnaby, British Columbia (CA)

( * ) Notice: Subject to any disclaimer, the term of this patent is extended or adjusted under 35 U.S.C. 154(b) by 341 days.

(21) Appl. No.: 13/183,684

(22) Filed: Jul. 15, 2011

(65) Prior Publication Data

US 2011/0316422 A1 Dec. 29, 2011

Related U.S. Application Data

(63) Continuation-in-part of application No. 12/982,758, filed on Dec. 30, 2010, now Pat. No. 8,493,000, and a continuation-in-part of application No. 13/171,973, filed on Jun. 29, 2011, now Pat. No. 8,384,121.

(60) Provisional application No. 61/292,137, filed on Jan. 4, 2010, provisional application No. 61/315,903, filed on Mar. 19, 2010, provisional application No. 61/363,179, filed on Jul. 9, 2010, provisional application No. 61/376,707, filed on Aug. 25, 2010, provisional application No. 61/390,128, filed on Oct. 5, 2010, provisional application No. 61/393,027, filed on Oct. 14, 2010, provisional application No. 61/359,467, filed on Jun. 29, 2010, provisional application No. 61/433,249, filed on Jan. 16, 2011, provisional application No. 61/445,416, filed on Feb. 22, 2011, provisional application No. 61/447,680, filed on Feb. 28, 2011.

(51) Int. Cl.
*H01L 27/15* (2006.01)

(52) U.S. Cl.
USPC ............ 257/81; 257/82; 257/88; 257/99; 315/185 R; 315/192; 315/122; 315/291; 315/312

(58) Field of Classification Search
USPC .......... 257/11, 79, 81, 99, 88, 82; 315/169.1, 315/169.3, 122, 127, 307, 312, 291, 185 R, 315/192, 193, 185 S
See application file for complete search history.

(56) References Cited

U.S. PATENT DOCUMENTS 4,675,575 A * 6/1987 Smith et al. ............... 315/185 S
5,081,520 A 1/1992 Yoshii et al.
(Continued)

FOREIGN PATENT DOCUMENTS

EP 0265077 4/1988
EP 1067598 1/2001
(Continued)

OTHER PUBLICATIONS

International Search Report and Written Opinion mailed Jun. 2, 2011 for International Application No. PCT/CA2011/050006 (7 pages).

(Continued)

*Primary Examiner* — Haiss Philogene
(74) *Attorney, Agent, or Firm* — Bingham McCutchen LLP

(57) ABSTRACT

In accordance with certain embodiments, an illumination system comprising a plurality of power strings features elements facilitating compensation for failure of one or more light-emitting elements connected along each power string.

37 Claims, 6 Drawing Sheets

(56) References Cited

U.S. PATENT DOCUMENTS

| | | |
|---|---|---|
| 5,631,191 A | 5/1997 | Durand et al. |
| 5,918,113 A | 6/1999 | Higashi et al. |
| 6,281,450 B1 | 8/2001 | Urasaki et al. |
| 6,357,889 B1 | 3/2002 | Duggal et al. |
| 6,478,909 B1 | 11/2002 | Tuttle |
| 6,501,102 B2 | 12/2002 | Mueller-mach et al. |
| 6,513,949 B1 | 2/2003 | Marshall et al. |
| 6,576,488 B2 | 6/2003 | Collins, III et al. |
| 6,603,258 B1 | 8/2003 | Mueller-mach et al. |
| 6,614,103 B1 | 9/2003 | Durocher et al. |
| 6,621,211 B1 | 9/2003 | Srivastava et al. |
| 6,642,652 B2 | 11/2003 | Collins, III et al. |
| 6,650,044 B1 | 11/2003 | Lowery |
| 6,685,852 B2 | 2/2004 | Setlur et al. |
| 6,689,999 B2 * | 2/2004 | Haines et al. .............. 250/205 |
| 6,733,711 B2 | 5/2004 | Durocher et al. |
| 6,936,857 B2 | 8/2005 | Doxsee et al. |
| 6,939,481 B2 | 9/2005 | Srivastava et al. |
| 6,965,361 B1 | 11/2005 | Sheats et al. |
| 6,998,777 B2 | 2/2006 | Suehiro et al. |
| 7,005,679 B2 | 2/2006 | Tarsa et al. |
| 7,025,651 B2 | 4/2006 | Song et al. |
| 7,052,924 B2 | 5/2006 | Daniels et al. |
| 7,115,983 B2 | 10/2006 | Wagner |
| 7,122,405 B2 | 10/2006 | Tiao |
| 7,163,327 B2 | 1/2007 | Henson et al. |
| 7,206,507 B2 | 4/2007 | Lee et al. |
| 7,207,693 B2 | 4/2007 | Ratcliffe |
| 7,217,956 B2 | 5/2007 | Daniels et al. |
| 7,244,326 B2 | 7/2007 | Craig et al. |
| 7,256,483 B2 | 8/2007 | Epler et al. |
| 7,259,030 B2 | 8/2007 | Daniels et al. |
| 7,294,861 B2 | 11/2007 | Schardt et al. |
| 7,294,961 B2 | 11/2007 | Daniels et al. |
| 7,316,488 B2 | 1/2008 | Wall, Jr. |
| 7,319,246 B2 | 1/2008 | Soules et al. |
| 7,335,951 B2 | 2/2008 | Nishi et al. |
| 7,344,902 B2 | 3/2008 | Basin et al. |
| 7,344,952 B2 | 3/2008 | Chandra |
| 7,427,782 B2 | 9/2008 | Daniels et al. |
| 7,482,760 B2 * | 1/2009 | Jungwirth et al. ........ 315/185 R |
| 7,488,088 B2 | 2/2009 | Brukilacchio |
| 7,488,621 B2 | 2/2009 | Epler et al. |
| 7,498,734 B2 | 3/2009 | Suehiro et al. |
| 7,564,070 B2 | 7/2009 | Sayers et al. |
| 7,618,157 B1 | 11/2009 | Galvez et al. |
| 7,638,854 B2 | 12/2009 | Tanaka et al. |
| 7,642,708 B2 | 1/2010 | Juestel et al. |
| 7,656,371 B2 | 2/2010 | Shimizu et al. |
| 7,663,234 B2 | 2/2010 | Sun et al. |
| 7,682,850 B2 | 3/2010 | Harbers et al. |
| 7,703,942 B2 | 4/2010 | Narendran et al. |
| 7,723,733 B2 | 5/2010 | Daniels et al. |
| 7,740,373 B2 | 6/2010 | Yoon et al. |
| 7,758,221 B2 | 7/2010 | Weijers |
| 7,766,536 B2 | 8/2010 | Peifer et al. |
| 7,775,685 B2 | 8/2010 | Loh |
| 7,791,093 B2 | 9/2010 | Basin et al. |
| 7,811,843 B1 | 10/2010 | Lai |
| 7,819,539 B2 | 10/2010 | Kim et al. |
| 7,821,023 B2 | 10/2010 | Yuan et al. |
| 7,828,459 B2 | 11/2010 | Rains |
| 7,838,346 B2 | 11/2010 | Tokunaga |
| 7,847,302 B2 | 12/2010 | Basin et al. |
| 7,855,092 B2 | 12/2010 | Shimizu et al. |
| 7,858,198 B2 | 12/2010 | Kashiwagi et al. |
| 7,858,408 B2 | 12/2010 | Mueller et al. |
| 7,863,760 B2 | 1/2011 | Daniels et al. |
| 7,897,483 B2 | 3/2011 | Yamazaki et al. |
| 7,898,085 B2 | 3/2011 | Fujimori et al. |
| 7,902,550 B2 | 3/2011 | Yamazaki |
| 7,902,560 B2 | 3/2011 | Bierhuizen et al. |
| 7,909,480 B2 | 3/2011 | Kang et al. |
| 7,909,496 B2 | 3/2011 | Matheson et al. |
| 7,932,531 B2 | 4/2011 | Lin et al. |
| 7,972,031 B2 | 7/2011 | Ray et al. |
| 7,997,784 B2 | 8/2011 | Tasi |
| 8,384,121 B2 * | 2/2013 | Tischler et al. .............. 257/99 |
| 8,466,488 B2 * | 6/2013 | Tischler et al. .............. 257/99 |
| 8,493,000 B2 * | 7/2013 | Jungwirth .................. 315/307 |
| 2003/0019735 A1 | 1/2003 | Howie et al. |
| 2005/0056948 A1 | 3/2005 | Uchiyama |
| 2005/0183884 A1 | 8/2005 | Su |
| 2005/0230853 A1 | 10/2005 | Yoshikawa |
| 2006/0001055 A1 | 1/2006 | Ueno et al. |
| 2006/0228973 A1 | 10/2006 | Janning |
| 2007/0069663 A1 | 3/2007 | Burdalski et al. |
| 2007/0096113 A1 | 5/2007 | Inoshita et al. |
| 2007/0096272 A1 | 5/2007 | Wang |
| 2007/0145884 A1 | 6/2007 | Wu et al. |
| 2007/0223219 A1 | 9/2007 | Medendorp, Jr. et al. |
| 2007/0252512 A1 | 11/2007 | Bertram et al. |
| 2007/0297020 A1 | 12/2007 | Shen et al. |
| 2008/0019134 A1 | 1/2008 | Mukai |
| 2008/0179602 A1 * | 7/2008 | Negley et al. .............. 257/88 |
| 2008/0179611 A1 | 7/2008 | Chitnis et al. |
| 2008/0315228 A1 | 12/2008 | Krames et al. |
| 2009/0002810 A1 | 1/2009 | Jeon et al. |
| 2009/0026915 A1 | 1/2009 | Nagatomi et al. |
| 2009/0073350 A1 | 3/2009 | Toyama et al. |
| 2009/0095966 A1 | 4/2009 | Keller et al. |
| 2009/0096370 A1 | 4/2009 | Murazaki et al. |
| 2009/0109668 A1 | 4/2009 | Isobe |
| 2009/0178834 A1 | 7/2009 | Akutsu et al. |
| 2009/0212257 A1 | 8/2009 | Sohn et al. |
| 2009/0239086 A1 | 9/2009 | Ishizuka et al. |
| 2009/0243457 A1 | 10/2009 | Jung et al. |
| 2009/0244882 A1 | 10/2009 | Samber et al. |
| 2009/0256163 A1 | 10/2009 | Chakraborty |
| 2010/0001631 A1 | 1/2010 | Gotoh et al. |
| 2010/0051984 A1 | 3/2010 | West |
| 2010/0060144 A1 | 3/2010 | Justel et al. |
| 2010/0085727 A1 | 4/2010 | Igarashi et al. |
| 2010/0096977 A1 | 4/2010 | Lee et al. |
| 2010/0207536 A1 | 8/2010 | Burdalski et al. |
| 2010/0214777 A1 | 8/2010 | Suehiro et al. |
| 2010/0244071 A1 | 9/2010 | Wada et al. |
| 2010/0277084 A1 | 11/2010 | Lee et al. |
| 2010/0283072 A1 | 11/2010 | Kazlas et al. |
| 2010/0295070 A1 | 11/2010 | Su et al. |
| 2010/0295077 A1 | 11/2010 | Melman |
| 2010/0295078 A1 | 11/2010 | Chen et al. |
| 2010/0320928 A1 | 12/2010 | Kaihotsu et al. |
| 2011/0002140 A1 | 1/2011 | Tsukahara et al. |
| 2011/0031516 A1 | 2/2011 | Basin et al. |
| 2011/0045619 A1 | 2/2011 | Ling |
| 2011/0058372 A1 | 3/2011 | Lerman et al. |
| 2011/0063838 A1 | 3/2011 | Dau et al. |
| 2011/0101399 A1 | 5/2011 | Suehiro et al. |
| 2011/0104834 A1 | 5/2011 | Suehiro et al. |
| 2011/0108878 A1 | 5/2011 | Namiki et al. |
| 2011/0114989 A1 | 5/2011 | Suehiro et al. |
| 2011/0163681 A1 | 7/2011 | Dau et al. |
| 2011/0163683 A1 | 7/2011 | Steele et al. |
| 2011/0180818 A1 | 7/2011 | Lerman et al. |
| 2011/0193105 A1 | 8/2011 | Lerman et al. |
| 2011/0193106 A1 | 8/2011 | Lerman et al. |
| 2011/0193114 A1 | 8/2011 | Lerman et al. |
| 2011/0195532 A1 | 8/2011 | Lerman et al. |
| 2011/0198631 A1 | 8/2011 | Lerman et al. |
| 2011/0198632 A1 | 8/2011 | Lerman et al. |
| 2011/0204390 A1 | 8/2011 | Lerman et al. |
| 2011/0204391 A1 | 8/2011 | Lerman et al. |

FOREIGN PATENT DOCUMENTS

| | | |
|---|---|---|
| EP | 1473978 | 11/2004 |
| EP | 1653523 | 5/2006 |
| EP | 1770788 | 4/2007 |
| EP | 2017890 | 1/2009 |
| TW | 423166 | 9/1999 |
| WO | WO-90/01751 | 2/1990 |
| WO | WO-99/060829 | 11/1999 |
| WO | WO-2005/062382 | 7/2005 |

(56) References Cited

FOREIGN PATENT DOCUMENTS

| WO | WO-2007/067758 | 6/2007 |
| WO | WO-2007/105853 | 9/2007 |
| WO | WO-08/051397 | 5/2008 |
| WO | WO-09/079040 | 6/2009 |
| WO | WO-10/098273 | 9/2010 |

OTHER PUBLICATIONS

International Search Report and Written Opinion mailed Sep. 7, 2011 for International Application No. PCT/CA2011/050399 (11 pages).

* cited by examiner

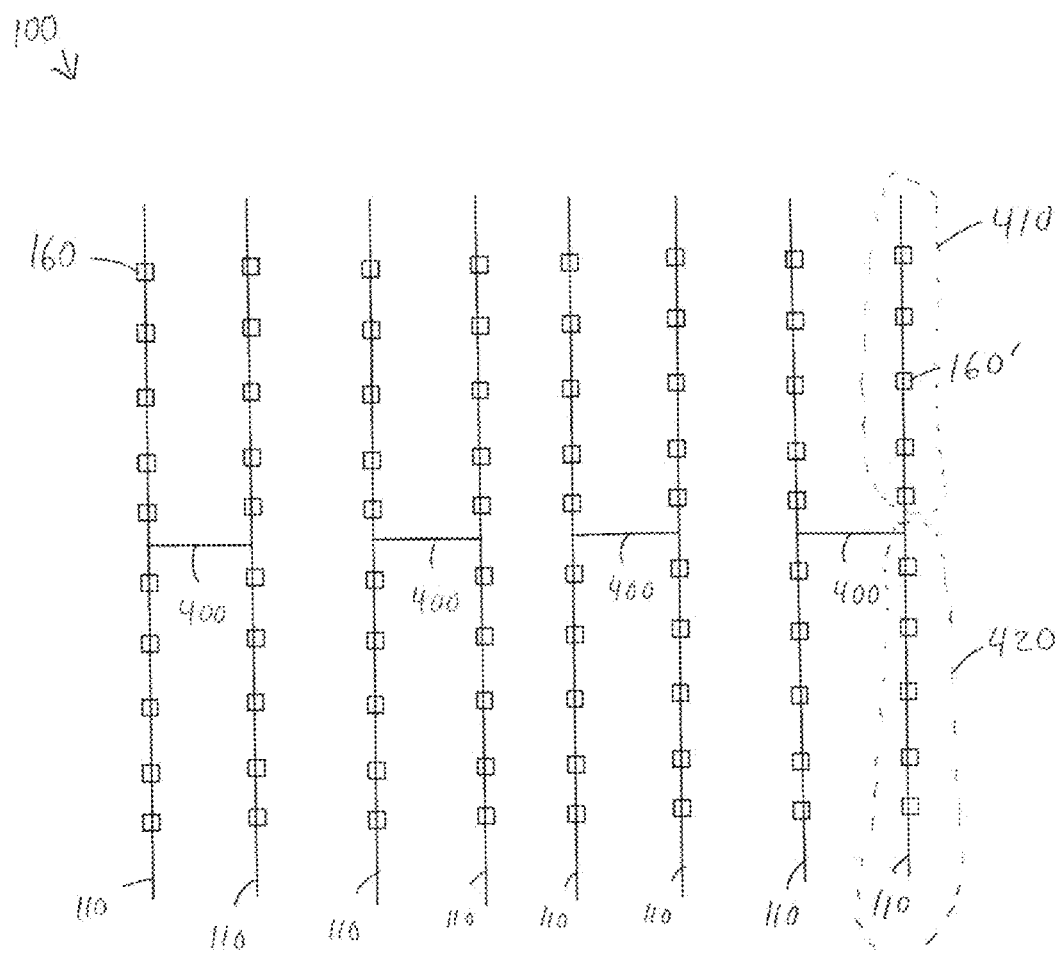

FAILURE MITIGATION IN ARRAYS OF LIGHT-EMITTING DEVICES

RELATED APPLICATIONS

This application (i) is a continuation-in-part of U.S. patent application Ser. No. 12/982,758, filed Dec. 30, 2010, now U.S. Pat. No. 8,493,000 which claims the benefit of and priority to U.S. Provisional Patent Application No. 61/292,137, filed Jan. 4, 2010, U.S. Provisional Patent Application No. 61/315,903, filed Mar. 19, 2010, U.S. Provisional Patent Application No. 61/363,179, filed Jul. 9, 2010, U.S. Provisional Patent Application No. 61/376,707, filed Aug. 25, 2010, U.S. Provisional Patent Application No. 61/390,128, filed Oct. 5, 2010, and U.S. Provisional Patent Application No. 61/393,027, filed Oct. 14, 2010, and (ii) is a continuation-in-part of U.S. patent application Ser. No. 13/171,973, filed Jun. 29, 2011, now U.S. Pat. No. 8,384,121 which claims the benefit of and priority to U.S. Provisional Patent Application No. 61/359,467, filed Jun. 29, 2010, U.S. Provisional Patent Application No. 61/363,179, filed Jul. 9, 2010, U.S. Provisional Patent Application No. 61/376,707, filed Aug. 25, 2010, U.S. Provisional Patent Application No. 61/390,128, filed Oct. 5, 2010, U.S. Provisional Patent Application No. 61/393,027, filed Oct. 14, 2010, U.S. Provisional Patent Application No. 61/433,249, filed Jan. 16, 2011, U.S. Provisional Patent Application No. 61/445,416, filed Feb. 22, 2011, and U.S. Provisional Patent Application No. 61/447,680, filed Feb. 28, 2011. The entire disclosure of each of these applications is hereby incorporated herein by reference.

FIELD OF THE INVENTION

The present invention generally relates to light-emitting devices, and more specifically to failure mitigation in array-based light-emitting devices.

BACKGROUND

Discrete light sources such as light-emitting diodes (LEDs) are an attractive alternative to incandescent light bulbs in illumination devices due to their higher efficiency, smaller form factor, longer lifetime, and enhanced mechanical robustness. LEDs may be grouped in clusters or arrays to provide a desired light output corresponding to design requirements and/or application specifications. Such multiple-LED groups combine the aforementioned advantages of LEDs with the larger light outputs of conventional light sources, enabling general-illumination applications. For example, when compared to incandescent lights, LED arrays may emit at comparable intensities with many times the efficiency and at a fraction of the operating costs.

However, lighting devices featuring arrays of interconnected LEDs do suffer from issues that plague all interconnected networks of devices—when a single device fails, the failure may degrade the performance of other devices, or even shut one or more (or even all) of them off entirely. One or more LEDs may fail during manufacture or operation due to a fault in, e.g., the LED die itself, one or more of the conductive traces supplying power to the LED, the substrate to which the LED is attached, or an electrical or mechanical connection between the LED contacts and the traces. While in some cases the failure of a single LED may be substantially imperceptible to an observer, the failure of one or more interconnected groups of LEDs (which, as mentioned above, may result from the failure of even a single LED) may result in a highly perceptible disruption in the illumination intensity and/or uniformity. Furthermore, replacement of faulty LEDs once integrated into a lighting system may be impractical. Thus, there is a need for methods of failure mitigation in illumination systems incorporating groups of interconnected discrete light sources such as LEDs.

SUMMARY

In accordance with certain embodiments, an illumination device incorporates, electrically connected to a power source, multiple "power strings," i.e., paths for the provision of current and/or voltage from the power source to groups of light-emitting elements (LEEs) such as LEDs. Each power string includes a power conductor, such as an electrical trace, on which multiple LEEs are connected in, e.g., series. Each LEE bridges a gap in the power conductor between a pair of contacts. An element facilitating compensation of the failure of the LEE is located on the power conductor proximate one or more (or even each) of the LEEs. The failure-mitigation element may compensate for at least a portion of the light lost due to the failed LEE, and/or may, at a minimum, enable continued operation of the remaining LEEs on the failed LEE's power string. In alternative embodiments, arrangements and/or interconnections of the power strings are utilized to mitigate the performance impact of the failure of parts of or entire strings during operation of the illumination device.

In an aspect, embodiments of the invention feature an illumination system including or consisting essentially of a plurality of power strings. Each power string includes or consists essentially of a power conductor, and along each power conductor, a plurality of contact pairs interrupting and spaced apart along the power conductor, the contacts within a pair being insulatively spaced apart and electrically bridged by a light-emitting element so that the light-emitting elements are connected along the power conductor, as well as an element facilitating compensation for failure of the associated light-emitting element at least at one contact pair.

Embodiments of the invention may include one or more of the following in any of a variety of combinations. At least one (or even all) of the light-emitting elements may include or consist essentially of a light-emitting diode and/or an unpackaged light-emitting diode. The light-emitting elements may be electrically connected in series along the power conductor. The element may be an additional area on each of the contacts of the contact pair, the additional area extending beyond the associated light-emitting element and being bridgeable by a replacement light-emitting element or a shorting member. The associated light-emitting element may be non-centered on the bridged contacts.

The element may be an additional associated light-emitting element, and the associated light-emitting element and the additional associated light-emitting element may both be on a single die. The associated light-emitting element and the additional associated light-emitting element may be on separate dies, and the associated light-emitting element may be adjacent to the additional associated light-emitting element and also electrically bridging the contacts. The system may include a power source providing a current level sufficient to drive two or more light-emitting elements across each contact pair but sufficiently small to avoid damage to an undamaged light-emitting element in the event of damage to the associated light-emitting element or the additional associated light-emitting element. The element may include or consist essentially of an open-circuit-detection element adjacent to the associated light-emitting element and bridging the contacts, and the open-circuit-detection element may be configured to sense whether the associated light-emitting element is open and, if so, to short-circuit the contacts. The system may include a plurality of shorting members cross-connecting at least one of the power strings with at least one other power string.

In another aspect, embodiments of the invention feature an illumination system including or consisting essentially of a plurality of power strings connectable to a power source, each power string including a power conductor, and along each power conductor, a plurality of contact pairs interrupting and spaced apart along the power conductor. The contacts within a pair are insulatively spaced apart and electrically bridged by a light-emitting element so that the light-emitting elements are connected along the power conductor. The light-emitting elements occupy points on a pattern and the power strings follow nonlinear paths through the pattern, such that the light-emitting elements along each power string are not linearly disposed within the pattern.

Embodiments of the invention may include one or more of the following in any of a variety of combinations. At least one (or even all) of the light-emitting elements may include or consist essentially of a light-emitting diode and/or an unpackaged light-emitting diode. The light-emitting elements may be electrically connected in series along the power conductor. The pattern may be a rectilinear grid or a hexagonal grid. The system may include a plurality of shorting members cross-connecting at least one of the power strings with at least one other power string.

In yet another aspect, embodiments of the invention feature an illumination system including or consisting essentially of a light-emitting-element array that includes or consists essentially of a plurality of light-emitting-element strings, and a controller for detecting a light-emitting-element string failure and activating a reserved light-emitting-element string located proximately to the failed light-emitting-element string.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. As used herein, the term "substantially" means ±10%, and in some embodiments, ±5%.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 4 is a schematic illustration of multiple strings of light-emitting devices, various of which are cross-connected via shorting members, in accordance with various embodiments of the invention.

DETAILED DESCRIPTION

Figure 1A:
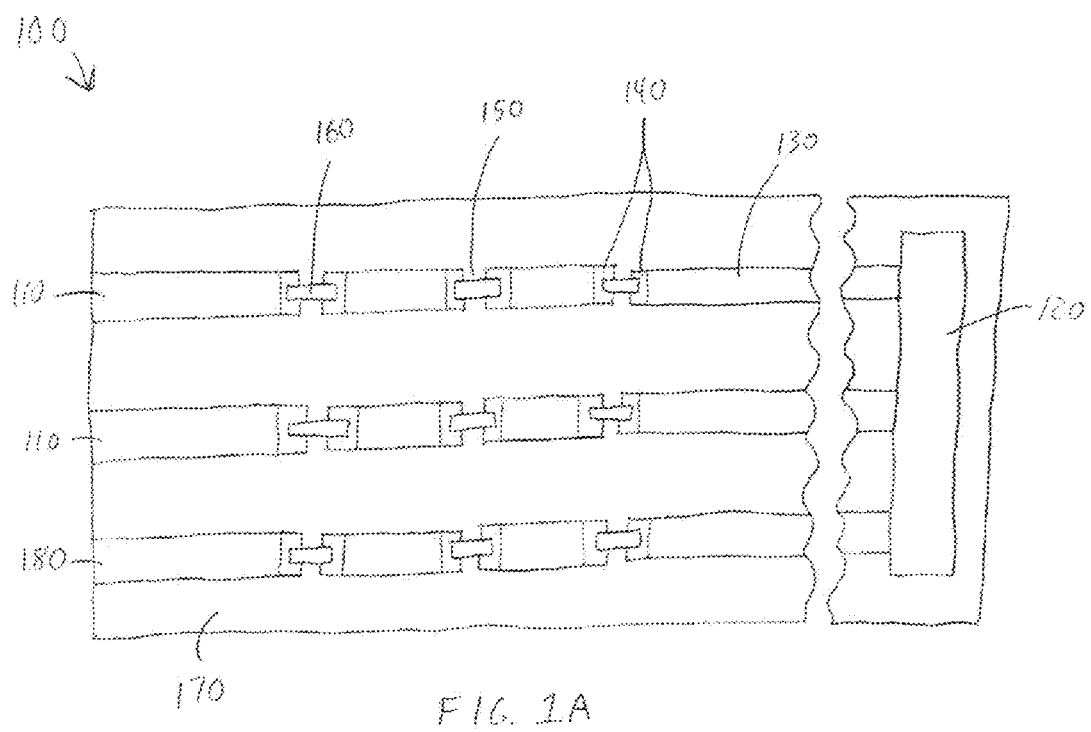
FIG. 1A is a schematic illustration of an illumination system featuring multiple strings of serially connected light-emitting devices in accordance with various embodiments of the invention.

FIG. 1A depicts an exemplary illumination system 100 in accordance with embodiments of the present invention, although alternative systems with similar functionality are also within the scope of the invention. The illumination system 100 may include or consist essentially merely of an array of light-emitting elements (LEEs), or may additionally incorporate any of a variety of other electronic devices such as sensors, processors, controllers, and the like. The term "light-emitting element" is defined as any device that emits electromagnetic radiation within a wavelength regime of interest, for example, visible, infrared or ultraviolet regime, when activated, by applying a potential difference across the device and/or passing a current through the device. Examples of LEEs include solid-state, organic, polymer, phosphor-coated or high-flux LEDs, microLEDs, laser diodes, and other similar devices as would be readily understood. The emitted radiation of an LEE may be visible, such as red, blue, or green, or invisible, such as infrared or ultraviolet. An LEE may produce radiation of a spread of wavelengths. An LEE may include a phosphorescent or fluorescent material for converting a portion of its emissions from one set of wavelengths to another. An LEE may include multiple LEEs, each emitting essentially the same or different wavelengths.

As depicted in FIG. 1A, illumination system 100 includes multiple power strings 110 each connected to a power source 120. The power source 120 may be any suitable source of AC or DC power (e.g., one or more batteries, solar cells, etc.) and/or may be a suitable connection to AC line current that features suitable electronics (e.g., one or more transformers) to condition the line current for utilization by the devices connected to the power string 110. As shown, a single power source 120 may supply power to each of the power strings 110, but in alternative embodiments one or more of the power strings 110 has a separated dedicated power source 120.

Each power string 110 includes a power conductor 130, along which multiple pairs of contacts 140 are spaced apart with an insulative space 150 (e.g., a gap) therebetween. Although each contact 140 of a contact pair is depicted as a discrete region along the power conductor 130, each contact 140 may merely be a portion of the power conductor 130 to which an electronic device is connected. In various embodiments, one or each of the contacts 140 has a different thickness and/or shape than the remaining portion(s) of the power conductor 130 in order to, e.g., facilitate thermal dissipation via heat spreading. An LEE 160 is disposed across each of the insulative spaces 150, electrically bridging the pair of contacts 140; thus, the LEEs 160 in a single power string 110 are typically connected in series. (The multiple power strings 110 are typically electrically connected in parallel, as shown in FIG. 1A.) While FIG. 1 shows the LEEs in power string 110 to be electrically coupled in series, a power string may feature any combination of one or more LEEs electrically connected in series, in parallel, or in a series-parallel combination with optional fuses, antifuses, current-limiting resistors, zener diodes, transistors, and other electronic components to protect the LEEs from electrical fault conditions and limit or control the current flow through individual LEEs or electrically-connected combinations thereof. A power string may also include a combination of two or more LEEs electrically connected in series, in parallel, or in a series-parallel combination of LEEs without additional electronic components. While generally the LEEs 160 are substantially identical to each other, in various embodiments one or more of the LEEs 160 is different from one or more of the others. One or more of the LEEs 160 may be mechanically and electrically connected to its contacts 140 via an adhesive, e.g., a pressure-activated anisotropically conductive adhesive (ACA) as described in U.S. patent application Ser. No. 13/171,973, filed on Jun. 29, 2011 (the '973 application), the entire disclosure of which is incorporated by reference herein. In other embodiments any of a variety of other means of mechanical and/or electrical connection, e.g., solder, wire bonds, etc., are utilized. As further explained below, the LEEs of a string need not be arranged linearly.

The various portions of each power conductor 130, including contacts 140, may include or consist essentially of one or more conductive materials, e.g., a metal or metal alloy, carbon, etc. Power conductors 130 may be formed via conventional deposition, photolithography, etching processes, plating processes, or any of a variety of printing processes. For example, power conductors 130 may be formed via screen printing, flexographic printing, ink jet printing, and/or gravure printing. The power conductors 130 may include or consist essentially of a conductive ink, which may include one or more elements such as silver, gold, aluminum, chromium, copper, and/or carbon.

The power strings 110 are disposed on a suitable substrate 170, which may be rigid or yielding (i.e., deformable and/or flexible), as described in the '973 application. Substrate 170 may include or consist essentially of a semicrystalline or amorphous material, e.g., polyethylene naphthalate (PEN), polyethylene terephthalate (PET), polycarbonate, polyethersulfone, polyester, polyimide, polyethylene, and/or paper. Substrate 170 may comprise multiple layers, e.g., a deformable layer over a rigid layer, for example, a semicrystalline or amorphous material, e.g., PEN, PET, polycarbonate, polyethersulfone, polyester, polyimide, polyethylene, and/or paper formed over a rigid substrate for example comprising, glass, acrylic, aluminum, steel and the like. Depending upon the desired application for which embodiments of the invention are utilized, substrate 170 may be substantially optically transparent, translucent, or opaque. For example, substrate 170 may exhibit a transmittance or a reflectivity greater than 80% for optical wavelengths ranging between approximately 400 nm and approximately 600 nm. In some embodiments substrate 170 may exhibit a transmittance or a reflectivity of greater than 80% for one or more wavelengths emitted by semiconductor die 300. Substrate 170 may also be substantially insulating, and may have an electrical resistivity greater than approximately 100 ohm-cm, greater than approximately $1 \times 10^6$ ohm-cm, or even greater than approximately $1 \times 10^{10}$ ohm-cm.

The power source 120 may also include portions of or substantially all of drive circuitry, sensors, control circuitry, and/or dimming circuitry or the like, and may also be adhered (e.g., via an adhesive) or otherwise attached to substrate 170. Power source 120 may even be disposed on a circuit board (e.g., a printed circuit board) that itself may be mechanically and/or electrically attached to substrate 170. In other embodiments power source 120 is separate from substrate 170.

Figure 1B:
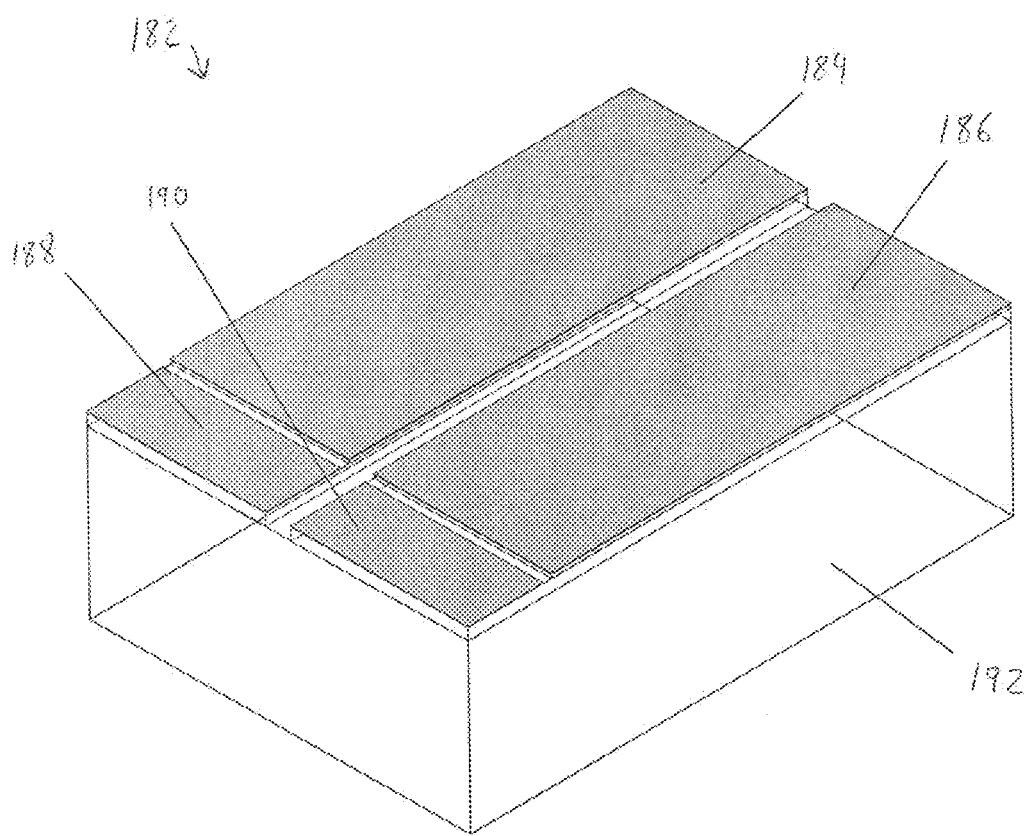
FIG. 1B is a schematic illustration of a light emitting device having two separate light emitting portions on the same substrate, in accordance with various embodiments of the invention.

In various embodiments, one or more of the LEEs 160 in illumination system 100 is subject to an electrical and/or mechanical failure. For example, the LEE itself (e.g., its semiconductor die) may fail, as may one or more of the connections between contacts 140 and LEE 160, or a portion of the power conductor 130 and/or substrate 170 may be damaged. The failure may result in an open circuit, a short circuit, or an intermittent connection of the LEE 160, and thus diminish the optical performance (e.g., luminous intensity and/or uniformity) and/or the electrical performance (e.g., efficiency, power factor) of the illumination system 100. Thus, embodiments of the invention feature one or more failure-mitigation elements associated with one or more of the contacts 140 (and/or LEEs 160) in order to prevent the failure of one or more LEE 160 (or even an entire power string 110) from greatly affecting the overall performance of the illumination system 100. In some embodiments of the invention, the failure-mitigation element is an additional discrete LEE 160 (or other suitable device) bridging the insulative area 150 (as detailed below), but in some embodiments such redundancy is supplied by the LEE 160 itself. Specifically, one or more of the LEEs 160 may have multiple light-emitting regions on a single discrete die, such that if one light-emitting region fails, the other(s) continue to emit light. The multiple light-emitting regions may share die-side contacts, or each region may have its own pair of die-side contacts, all of which are connected (e.g., in parallel) to contacts 140. For example, FIG. 1B depicts an LEE 182 having two separate p-contacts 184 and 186, and two separate n-contacts 188 and 190, formed on a substrate 192.

In some embodiments one or more reserve power strings 180 may be formed on substrate 170. Such reserve power strings 180 may be disposed between or among power strings 110 in a linear or other arrangement. One or more reserve power strings 180 may be electrically coupled to power source 120 to replace one or more damaged or inoperative power strings 110. In some embodiments, one or more power strings 110 fail open and need not be electrically decoupled from power source 120. In some embodiments one or more power strings 110 fail conductively and may be electrically decoupled from power source 120. The electrical coupling and electrical decoupling of power strings 110 and reserve power strings 180 may be accomplished by a variety of means, for example, with fusible links, anti-fusible links, cutting or electrical coupling of conductive traces 130, through a switch network, or otherwise.

In some embodiments, power source 120 incorporates a controller for detecting the failure of one or more of the power strings 110 (e.g., due to the failure of one or more of the LEEs 160 on the string) and for the subsequent activation of (e.g., via supply of power to) one or more reserve power strings 180 in proximity to the failed power string 110. The controller may utilize a switch matrix and be programmed to separately (and frequently, if not continuously) sense a condition that indicates that a power string 110 is damaged or non-operational, and should a sensed condition indicate a damaged or non-operational power string 110, to switch on an inactive, proximate reserve power string 180, and if necessary, to switch off the damaged or non-operational power string 110. In an embodiment the sensed condition is the voltage of and/or the current to the power string 110. The sensed condition may be a temperature, a light intensity, and/or any other parameter. In some embodiments, each power string 110 and reserve power string 180 has a unique address that may be used to determine the reserve power string 180 in closest proximity to the damaged or non-operational power string 110. In various embodiments, the total number of operational power strings 110 and/or the close proximity of reserve string 180 to the failed string 110 is sufficient such that, after the "replacement" of the failed string 110, the overall performance of illumination system 100 is not perceptibly or substantially changed. Reserve strings 180 may be present in illumination system 100 at regular intervals (i.e., between approximately the same number of initially operating power strings 110); since reserve strings 180 do not emit light during initial operation of illumination system 100, the substitution of a reserve string 180 for an inoperative power string 110 is preferably substantially imperceptible, as discussed above.

The controllers described herein may be provided as either software, hardware, or some combination thereof. A typical implementation utilizes a common programmable microcontroller or application-specific integrated circuit (ASIC) programmed as described above. However, the system may also be implemented on more powerful computational devices, such as a PC having a CPU board containing one or more processors. The controller may include a main memory unit for storing programs and/or data relating to the activation or deactivation described above. The memory may include random access memory (RAM), read only memory (ROM), and/or FLASH memory residing on commonly available hardware such as one or more ASICs, field programmable gate arrays (FPGA), electrically erasable programmable read-only memories (EEPROM), programmable read-only memories (PROM), or programmable logic devices (PLD). In some embodiments, the programs may be provided using external RAM and/or ROM such as optical disks, magnetic disks, as well as other commonly used storage devices.

For embodiments in which a controller is provided as a software program, the program may be written in any one of a number of high level languages such as FORTRAN, PASCAL, JAVA, C, C++, C#, LISP, Perl, BASIC, PYTHON or any suitable programming language.

Figure 2A:
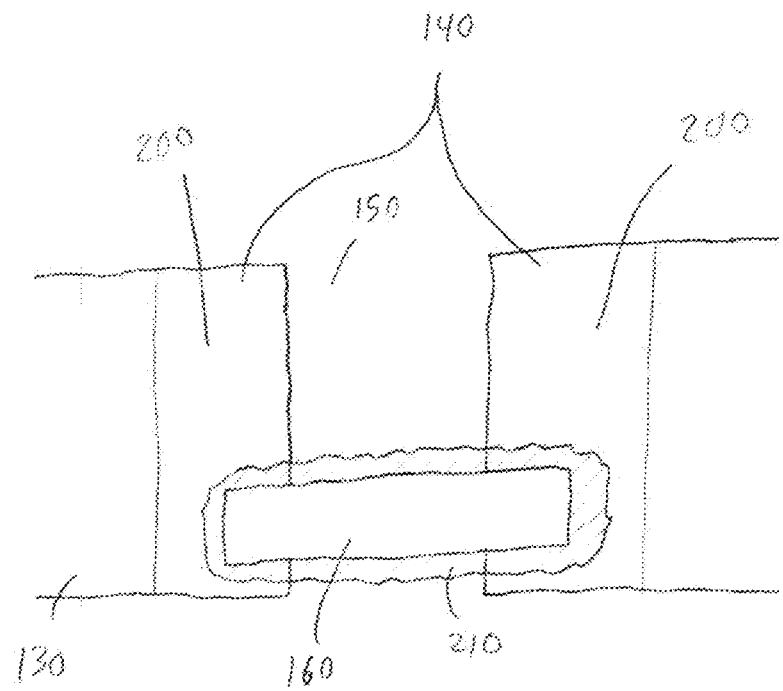
FIGS. 2A-2D are enlarged plan (FIGS. 2A and 2B) and cross-sectional (FIGS. 2C and 2D) views of various devices in the system of FIG. 1A connected between spaced-apart contact pairs in accordance with various embodiments of the invention.

As mentioned, another technique of mitigating the failure of an LEE 160 is the removal and replacement of the failed LEE 160 with another suitable LEE. However, removal of a failed LEE 160 may be inconvenient or difficult or impossible to achieve without damaging other portions of illumination system 100, e.g., one or more of the contacts 140, or leaving debris (and/or surface damage) that renders the replacement of the device impossible. As shown in FIG. 2A, embodiments of the present invention incorporate contacts 140 each having an area 200 large enough to accommodate two or more LEEs 160 (or other suitable devices, as described below) simultaneously in parallel. As shown in FIG. 2A, multiple LEEs 160 need not be connected to contacts 140 initially, but the LEEs 160 that are connected may not consume all of area 200 and/or may not be centered along area 200. Instead, an LEE 160 may be present between contacts 140 at one side of the area 200, leaving sufficient area 200 remaining to accommodate one or more other devices. As mentioned above, the LEE 160 may be mechanically and electrically connected to contacts 140 by any of a variety of techniques, for example with an adhesive 210, e.g., an ACA such as a pressure-activated ACA.

Figure 2B:
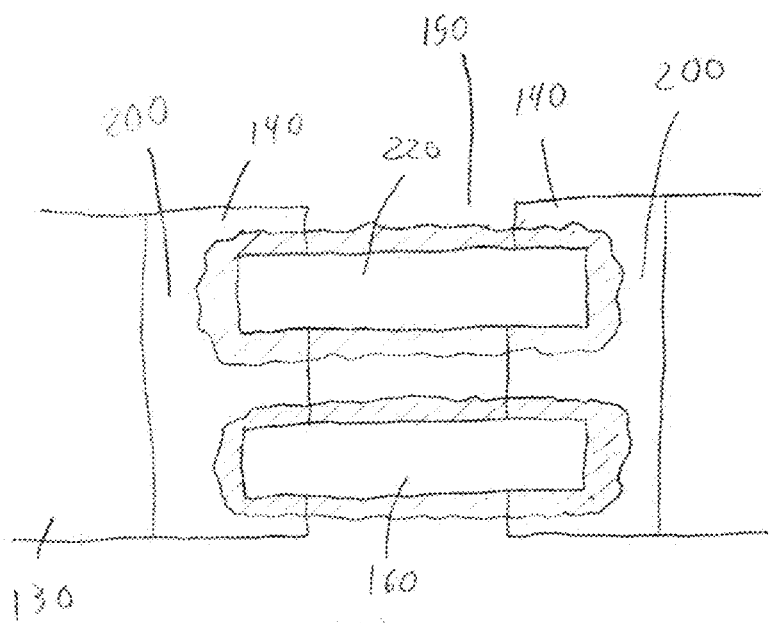

As shown in FIG. 2B, either before or after a failure of LEE 160, a device 220 may be placed adjacent to and in parallel with LEE 160 across the insulative space 150, bridging the contacts 140. The failed LEE 160 may be removed, but, particularly if the failure is an open circuit, removal of the failed LEE 160 may be unnecessary. The device 220 may simply be a shorting bar or the equivalent that electrically connects the two contacts 140; thus, even though no light is emitted from device 220, the remaining LEEs 160 in the power string 110 continue to function normally and any drop in performance of the illumination system 100 is substantially imperceptible. In some embodiments, device 220 is an electronic shunt capable of detecting an open-circuit failure of the LEE 160, and, upon the detection of the open circuit, electrically bridging (i.e., short circuiting) the contacts 140. (Suitable such electronic shunts include the Bourns LSP Series LED Shunt Protectors available from Bourns, Inc. of Riverside, Calif.)

In other embodiments, device 220 includes or consists essentially of a zener diode having a zener voltage higher than the nominal forward voltage of the LEE 160 with which it is in parallel. Thus, under normal operating conditions LEE 160 has all or substantially all the current delivered by the power conductor 130 flowing through it, and device 220 is effectively inert, since under such conditions the zener voltage is typically not exceeded. However, if LEE 160 should experience an open-circuit failure, power source 120 may provide the additional voltage required to activate the zener diode, and the current will continue to flow through power conductor 130, allowing the other LEEs 160 connected on that power conductor 130 to remain operational.

In other embodiments, device 220 includes or consists essentially of another LEE 160, which may be different from or substantially identical to the failed LEE 160. In cases in which the device 220 is connected after failure of the LEE 160, the operation and performance of the illumination system 100 is substantially identical to that prior to the failure of LEE 160. However, due to the abovementioned difficulties that may arise when adding or removing components of illumination system 100 once it is deployed, in some embodiments device 220 is placed in parallel to LEE 160 prior to the failure of LEE 160 (e.g., during the initial manufacture of illumination system 100). In such embodiments, during operation of illumination system 100 both LEE 160 and device 220 emit light, e.g., of substantially the same intensity and/or color coordinates. Power source 120 provides a current that is sufficiently large to drive both LEE 160 and device 220 in parallel, but also sufficiently small to avoid damage to device 220 (e.g., by overdriving) in the event of damage to or failure of LEE 160 (or vice versa). Thus, in the event of failure of LEE 160, the same current from power source 120 drives only device 220, which itself experiences a larger driving current due to the inoperability of LEE 160 and thus preferably emits light at a higher intensity than it did when both LEE 160 and device 220 were emitting in parallel. In some embodiments the light intensity emitted from device 220 operating alone is substantially equal to the cumulative intensity of the light emitted by device 220 and LEE 160 operating in parallel. In some embodiments, more than one device 220 bridges the contacts 140 with a single LEE 160.

Figure 2C:
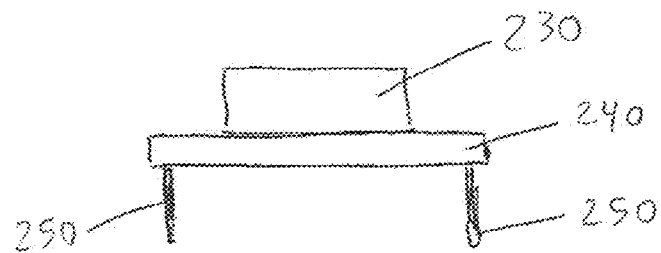
Figure 2D:
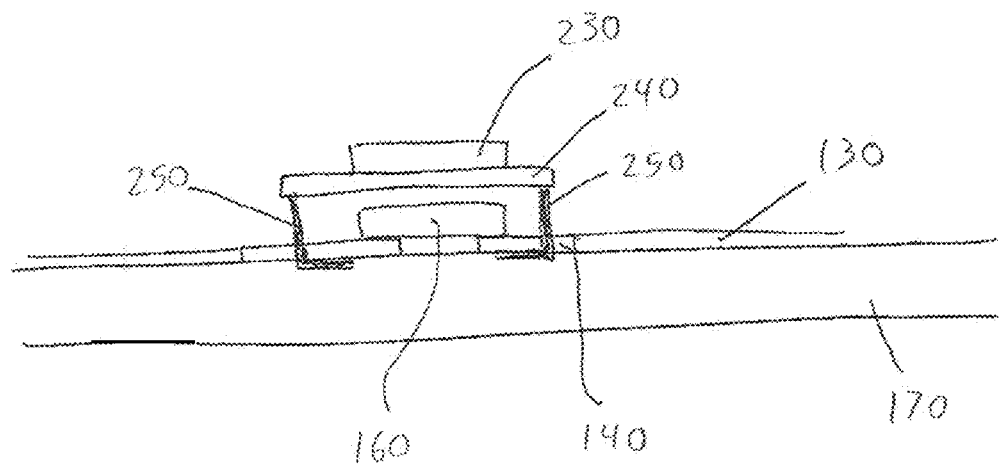

In one embodiment, as shown in FIG. 2C a replacement LEE 230 may be electrically coupled to a submount 240 with penetrating contacts 250, such that replacement LEE 230 and submount 240 may be positioned over all or a portion of a failed LEE 160. Penetrating contacts 250 penetrate all or a portion of contacts 140, power conductor 130, and/or substrate 170 to electrically couple replacement LEE 230 to contacts 140 or power conductor 130, in a fashion similar to "stapling" replacement LED 230 to substrate 170, as shown in FIG. 2D. The "staple" provides electrical coupling to contacts 140 and mechanically couples replacement LED 230 into illumination system 100. A tool may be provided to permit straightforward replacement of a failed LEE 160 by stapling the replacement LEE 230 over the failed LEE 160. Such a tool holds the replacement LEE 230 and permits alignment of the replacement LEE 230 in the proper position and attachment of the replacement LEE 230 to illumination system 100.

Figure 3:
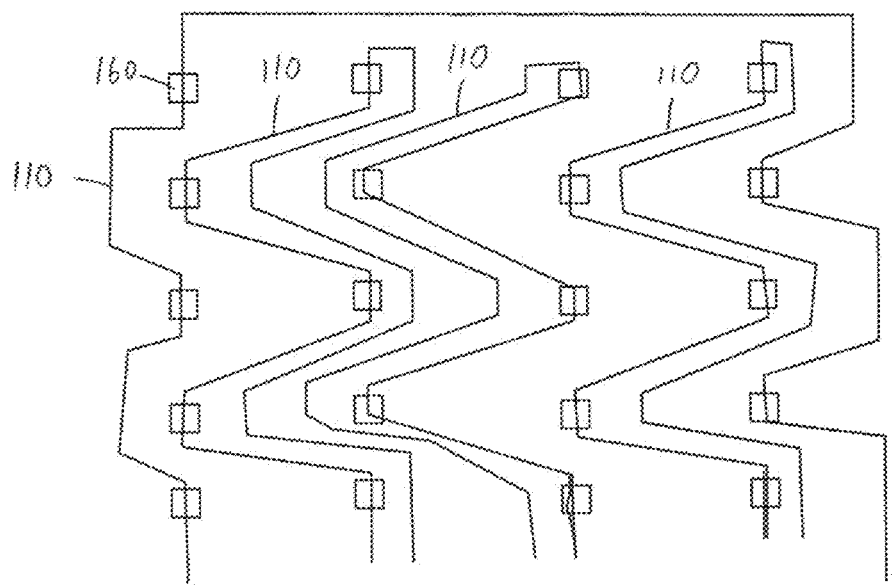
FIG. 3 is a schematic illustration of a layout of multiple strings of light-emitting devices for mitigating the visual impact of the failure of one of the strings, in accordance with various embodiments of the invention.

FIG. 3 depicts another technique to minimize or eliminate the visible impact of a failed string of LEEs that may be utilized instead of or in addition to any of the failure-mitigation techniques described herein. In FIG. 3, the LEEs 160 are arranged in a desired pattern, e.g., the substantially rectilinear grid shown, but are interconnected on power strings 110 such that adjacent (or at least proximate) LEEs 160 are parts of different power strings 110. As shown, the various power strings 110 may "zig-zag" between different portions of the pattern of LEEs 160 such that two or more power strings 110 form parallel linear portions of the pattern. For example, for a substantially linear or grid-like pattern of LEEs 160, the power strings 110 follow nonlinear paths through the pattern such that the LEEs 160 along each power string 110 are not linearly disposed within the pattern. Thus, upon failure of one of the power strings 110, the impact on the overall performance of illumination system 100 is minimized or even negligible. In some embodiments, illumination system 100 incorporates homogenizing optics and/or diffusers disposed over the LEEs 160 and spreading the light therefrom, even further diminishing any impact of a non-functional power string 110. The power strings 110 and/or LEEs 160 may even be configured three-dimensionally across multiple levels, enabling even more complicated routings of the power strings 110 that further diminish any visible impact of power-string failure. It will be understood by a person skilled in the art that the physical arrangement of the LEEs 160 may take multiple forms, for example the square grid shown in FIG. 3, as well as other grid patterns, for example rectangular, triangular, hexagonal, and the like.

FIG. 4 depicts yet another technique to minimize or eliminate the visible impact of a failed LEE 160, and which may be utilized instead of or in addition to any of the failure-mitigation techniques described herein. As shown, an illumination system 100 featuring multiple power strings 110 may also include one or more shorting members 400 cross-connecting at least one power string 110 with at least one other power string 110. Normally, as described above, the failure of an LEE 160 might result in the inoperability of the entire power string of which it is a part. However, the presence of the shorting member(s) 400 enables the continued operation of at least a portion of the power string 110 due to the electrical connection between that portion and another functioning power string 110. For example, in the event of the failure of the LEE 160' in FIG. 4, the failure of the portion 410 of its power string 110 may result. However, due to the presence of a shorting member 400, the portion 420 of the power string 110 continues to function, as power continues to be supplied to it from the adjacent power string 110 to which it is connected. In this manner the impact of failure of one or more LEEs 160 may be mitigated: rather than entire power strings 110 becoming inoperable due to such failures, only portions of those power strings 110 cease illumination, limiting the overall impact on the performance of illumination system 100. The power string 110, shorting members 400, and/or LEEs 160 may also include elements for limiting the current in each power string 110, or for dividing the current between electrically coupled power strings 110 such that the current in each power string 110 downstream of shorting members 400 is substantially equal.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An illumination system comprising:
   a plurality of power strings connectable to a power source, each power string comprising:
   a power conductor;
   along each power conductor, a plurality of contact pairs interrupting and spaced apart along the power conductor, the contacts within a pair being insulatively spaced apart and electrically bridged by a light-emitting element so that the light-emitting elements are connected along the power conductor; and
   at least at one contact pair, an element facilitating compensation for failure of the associated light-emitting element.

2. The system of claim 1, wherein at least one light-emitting element comprises a light-emitting diode.

3. The system of claim 1, wherein at least one light-emitting element comprises an unpackaged light-emitting diode.

4. The system of claim 1, wherein the light-emitting elements are electrically connected in series along the power conductor.

5. The system of claim 1, wherein the element is an additional area on each of the contacts of the contact pair, the additional area extending beyond the associated light-emitting element and being bridgeable by a replacement light-emitting element or a shorting member.

6. The system of claim 5, wherein the associated light-emitting element is non-centered on the bridged contacts.

7. The system of claim 1, wherein the element is an additional associated light-emitting element.

8. The system of claim 7, wherein the associated light-emitting element and the additional associated light-emitting element are both on a single die.

9. The system of claim 7, wherein the associated light-emitting element and the additional associated light-emitting element are on separate dies, the associated light-emitting element being adjacent to the additional associated light-emitting element and also electrically bridging the contacts.

10. The system of claim 9, further comprising a power source providing a current level sufficient to drive two or more light-emitting elements across each contact pair but sufficiently small to avoid damage to an undamaged light-emitting element in the event of damage to the associated light-emitting element or the additional associated light-emitting element.

11. The system of claim 1, wherein the element is an open-circuit-detection element adjacent to the associated light-emitting element and bridging the contacts, the open-circuit-detection element being configured to sense whether the associated light-emitting element is open and, if so, to short-circuit the contacts.

12. The system of claim 1, further comprising a plurality of shorting members cross-connecting at least one of the power strings with at least one other power string.

13. The system of claim 1, wherein at least one light-emitting element is at least one of mechanically or electrically connected to the contacts of a contact pair by an adhesive.

14. The system of claim 13, wherein the adhesive comprises a conductive adhesive.

15. The system of claim 14, wherein the adhesive comprises an anisotropically conductive adhesive.

16. The system of claim 1, wherein at least one light-emitting element is at least one of mechanically or electrically connected to the contacts of a contact pair by solder.

17. The system of claim 1, further comprising a flexible substrate on which the plurality of power strings is disposed.

18. The system of claim 1, wherein the element comprises a zener diode.

19. The system of claim 18, wherein a zener voltage of the zener diode is higher than a forward voltage sufficient to operate the associated light-emitting element.

20. The system of claim 1, further comprising:
a controller for detecting a power string failure and activating a reserved power string located proximately to the failed power string.

21. The system of claim 1, wherein at least one light-emitting element comprises a phosphorescent material for converting at least a portion of light emitted by the light-emitting element from one set of wavelengths to another.

22. An illumination system comprising:
a plurality of power strings connectable to a power source, each power string comprising a power conductor;
along each power conductor, a plurality of contact pairs interrupting and spaced apart along the power conductor, the contacts within a pair being insulatively spaced apart and electrically bridged by a light-emitting element so that the light-emitting elements are connected along the power conductor,
wherein the light-emitting elements occupy points on a pattern and the power strings follow nonlinear paths through the pattern, such that the light-emitting elements along each power string are not linearly disposed within the pattern.

23. The system of claim 22, wherein at least one light-emitting element comprises a phosphorescent material for converting at least a portion of light emitted by the light-emitting element from one set of wavelengths to another.

24. The system of claim 22, wherein at least one light-emitting element comprises a light-emitting diode.

25. The system of claim 22, wherein at least one light-emitting element comprises an unpackaged light-emitting diode.

26. The system of claim 22, wherein the light-emitting elements are electrically connected in series along the power conductor.

27. The system of claim 22, wherein the pattern is a rectilinear grid.

28. The system of claim 22, wherein at least one light-emitting element is at least one of mechanically or electrically connected to the contacts of a contact pair by an adhesive.

29. The system of claim 28, wherein the adhesive comprises a conductive adhesive.

30. The system of claim 29, wherein the adhesive comprises an anisotropically conductive adhesive.

31. The system of claim 22, wherein at least one light-emitting element is at least one of mechanically or electrically connected to the contacts of a contact pair by solder.

32. The system of claim 22, wherein the pattern is a hexagonal grid.

33. The system of claim 22, further comprising a flexible substrate on which the plurality of power strings is disposed.

34. The system of claim 22, further comprising a plurality of shorting members cross-connecting at least one of the power strings with at least one other power string.

35. The system of claim 22, further comprising a controller for detecting a power string failure and activating a reserved power string located proximately to the failed power string.

36. The system of claim 22, wherein the pattern is three-dimensional.

37. The system of claim 22, further comprising, disposed over the plurality of power strings, at least one of a homogenizing optic or a diffuser.

* * * * *